(12) United States Patent
Lee

(10) Patent No.: US 10,629,641 B2
(45) Date of Patent: Apr. 21, 2020

(54) FAN-OUT SENSOR PACKAGE AND OPTICAL-TYPE FINGERPRINT SENSOR MODULE INCLUDING THE SAME

(71) Applicant: SAMSUNG ELECTRONICS CO., LTD., Suwon-si (KR)

(72) Inventor: Jae Kul Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 16/037,629

(22) Filed: Jul. 17, 2018

(65) Prior Publication Data
US 2019/0123082 A1   Apr. 25, 2019

(30) Foreign Application Priority Data
Oct. 19, 2017  (KR) .......................... 10-2017-0136061

(51) Int. Cl.
*H01L 27/146* (2006.01)
*G06K 9/00* (2006.01)
*H01L 23/00* (2006.01)

(52) U.S. Cl.
CPC ...... *H01L 27/14618* (2013.01); *G06K 9/0004* (2013.01); *H01L 24/24* (2013.01);
(Continued)

(58) Field of Classification Search
CPC ... H01L 27/14618; H01L 24/24; H01L 24/25; H01L 27/14625; H01L 27/14678; H01L 27/14683; G06K 9/0004
See application file for complete search history.

(56) References Cited

U.S. PATENT DOCUMENTS 6,566,745 B1 * 5/2003 Beyne ............... H01L 27/14618
                                                   257/431
9,214,592 B2 * 12/2015 Oganesian ........ H01L 27/14618
(Continued)

FOREIGN PATENT DOCUMENTS

TW    201244072 A    11/2012
TW    201320314 A    5/2013
TW    201411820 A    3/2014

OTHER PUBLICATIONS

Search Report issued in corresponding Taiwanese Application No. 107124406, dated Feb. 18, 2019.

*Primary Examiner* — Utpal D Shah
(74) *Attorney, Agent, or Firm* — Sughrue Mion, PLLC

(57) ABSTRACT

A fan-out sensor package includes: a first connection member having a through-hole and including a first wiring layer; a sensor chip disposed in the through-hole; an optical lens disposed in the through-hole and attached to the sensor chip; an encapsulant encapsulating at least portions of the first connection member, the sensor chip, and the optical lens; and a second connection member including a first insulating layer disposed on the first connection member, the sensor chip, and the optical lens, a redistribution layer disposed on the first insulating layer, and a second insulating layer disposed on the first insulating layer and covering the redistribution layer. The redistribution layer electrically connects the first wiring layer and the connection pads, the first insulating layer has a cavity exposing at least a portion of one surface of the optical lens, and one side of the cavity is closed by the second insulating layer.

18 Claims, 13 Drawing Sheets

(52) U.S. Cl.
CPC ........ *H01L 24/25* (2013.01); *H01L 27/14625* (2013.01); *H01L 27/14678* (2013.01); *H01L 27/14683* (2013.01); *H01L 27/14636* (2013.01); *H01L 2224/16225* (2013.01); *H01L 2224/18* (2013.01); *H01L 2224/24155* (2013.01); *H01L 2224/24195* (2013.01); *H01L 2224/25171* (2013.01); *H01L 2224/73204* (2013.01); *H01L 2924/15311* (2013.01); *H01L 2924/181* (2013.01)

(56) References Cited

U.S. PATENT DOCUMENTS

| | | | |
|---|---|---|---|
| 9,496,247 B2 * | 11/2016 | Oganesian | H04N 5/2256 |
| 10,128,289 B2 * | 11/2018 | Wu | H01L 27/14636 |
| 2008/0083964 A1 * | 4/2008 | Fujimoto | H01L 27/14618 257/432 |
| 2008/0083980 A1 * | 4/2008 | Yang | H01L 27/14618 257/700 |
| 2008/0211075 A1 * | 9/2008 | Yang | H01L 27/14618 257/680 |
| 2010/0117530 A1 * | 5/2010 | Lin | H01L 33/486 313/512 |
| 2012/0043635 A1 | 2/2012 | Yang | |
| 2012/0249822 A1 | 10/2012 | Yoshida et al. | |
| 2013/0056844 A1 * | 3/2013 | Oganesian | H01L 27/14618 257/443 |
| 2014/0070349 A1 | 3/2014 | Oganesian | |
| 2015/0340397 A1 * | 11/2015 | Seo | H01L 27/14623 257/432 |
| 2018/0226515 A1 * | 8/2018 | Skeete | H01L 27/1469 |
| 2019/0148254 A1 * | 5/2019 | Na | H01L 23/481 257/774 |

* cited by examiner

FAN-OUT SENSOR PACKAGE AND OPTICAL-TYPE FINGERPRINT SENSOR MODULE INCLUDING THE SAME

CROSS-REFERENCE TO RELATED APPLICATION(S)

This application claims benefit of priority to Korean Patent Application No. 10-2017-0136061 filed on Oct. 19, 2017 in the Korean Intellectual Property Office, the disclosure of which is incorporated herein by reference in its entirety.

TECHNICAL FIELD

The present disclosure relates to a fan-out sensor package, and more particularly, to a fan-out sensor package capable of performing optical-type fingerprint recognition, and an optical-type fingerprint sensor module including the same.

BACKGROUND

In accordance with the generalization of the use of fingerprint sensor chips in smartphones and an increase in sizes of front displays of smartphones, demand for optical-type fingerprint sensor package technology, in which an under display structure is possible, has increased. In an optical-type fingerprint sensor package according to the related art, a structure in which a sensor chip is mounted on a ball grid array (BGA) substrate, connection pads of the sensor chips are connected to the BGA substrate by bonding wires, and the sensor chip is molded by a molding material has been mainly used.

However, in this case, due to bonding wires disposed on the sensor chip, a separate optical lens, or the like, a structure of the optical-type fingerprint sensor package may be somewhat complicated, and a size and a thickness of the optical-type fingerprint sensor package may be increased. In addition, it may be difficult to control a molding thickness, because a complicated molding process is required. Warpage of the entire optical-type fingerprint sensor package greatly occurs due to an asymmetrical structure, such that fingerprint sensing sensitivity is decreased and a yield at the time of mounting the optical-type fingerprint sensor package is also decreased. In addition, the warpage of the optical-type fingerprint sensor package generates a difficulty in stacking an infrared cut filter and a metal shield in a process of manufacturing the optical-type fingerprint sensor package in module form.

SUMMARY

An aspect of the present disclosure may provide a subminiature, ultra-thin fan-out sensor package in which a structure may be simple, a warpage problem may be solved, an optical recognition rate may be excellent, since an optical recognition region may be opened, and damage to the optical recognition region due to impact may be prevented, and an optical-type fingerprint sensor module including the same.

According to an aspect of the present disclosure, a fan-out sensor package may be provided, in which a sensor chip capable of performing optical-type fingerprint recognition is disposed in a through-hole of a first connection member in which a wiring layer is formed, a second connection member including an insulating layer and a redistribution layer is introduced on the first connection member and the sensor chip to electrically connect connection pads of the sensor chip and the wiring layer of the first connection member to each other, and a cavity is only formed in a portion of the insulating layer of the second connection member to expose a surface of an optical lens attached to the sensor chip.

According to an aspect of the present disclosure, a fan-out sensor package may include: a first connection member having a through-hole and including a first wiring layer; a sensor chip disposed in the through-hole and having an active surface having connection pads disposed thereon and an inactive surface opposing the active surface; an optical lens disposed in the through-hole and attached to the active surface of the sensor chip; an encapsulant encapsulating at least portions of the first connection member, the sensor chip, and the optical lens; and a second connection member including a first insulating layer disposed on the first connection member, the active surface of the sensor chip, and the optical lens, a redistribution layer disposed on the first insulating layer, and a second insulating layer disposed on the first insulating layer and covering the redistribution layer, wherein the redistribution layer electrically connects the first wiring layer and the connection pads, the first insulating layer has a cavity exposing at least a portion of one surface of the optical lens, and one side of the cavity is closed by the second insulating layer.

According to another aspect of the present disclosure, an optical-type fingerprint sensor module may include the fan-out sensor package as described above; and a display panel disposed on the fan-out sensor package, wherein the display panel is an organic light emitting diode (OLED) panel.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
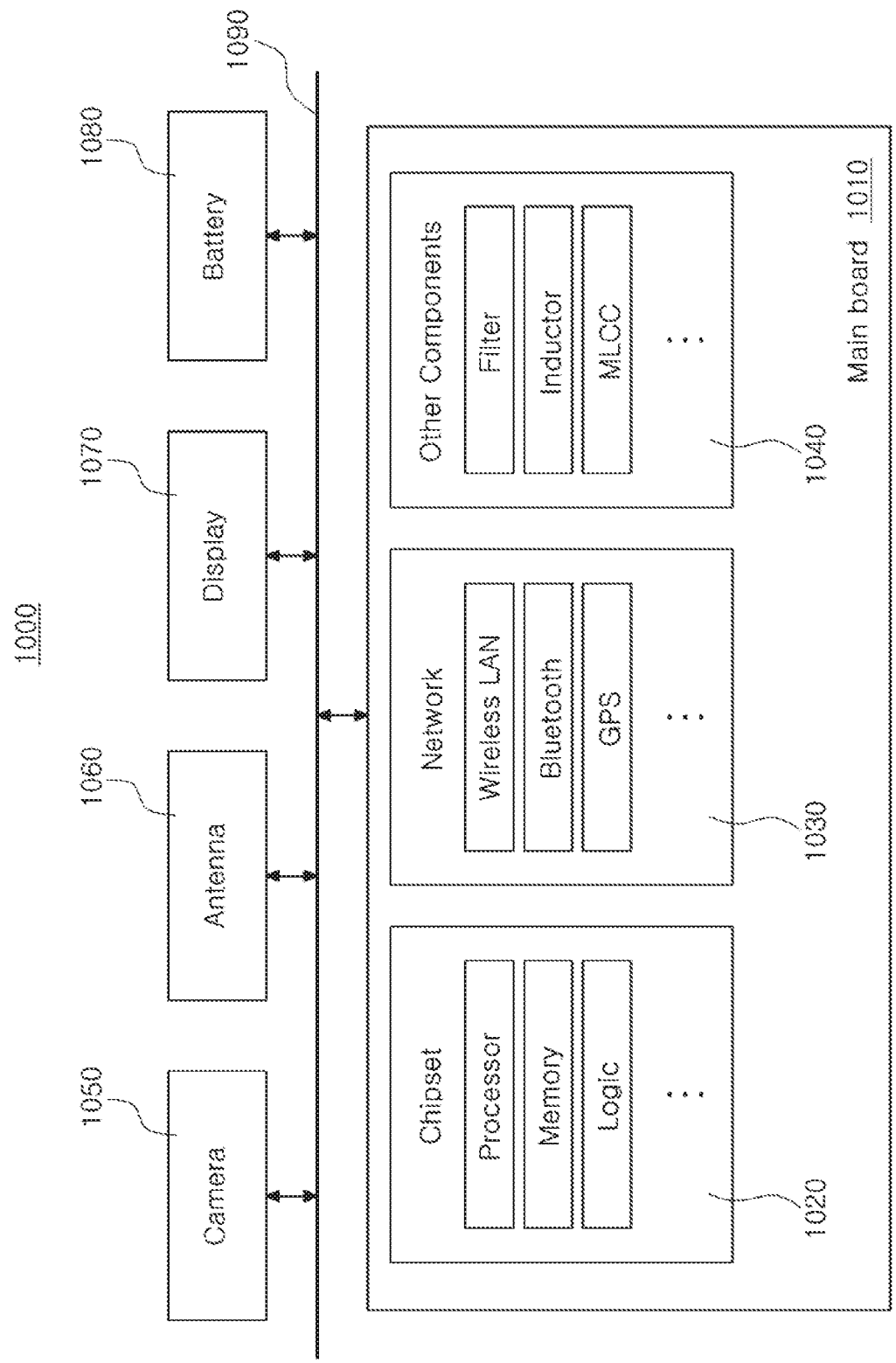
FIG. 1 is a schematic block diagram illustrating an example of an electronic device system.

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like.

However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
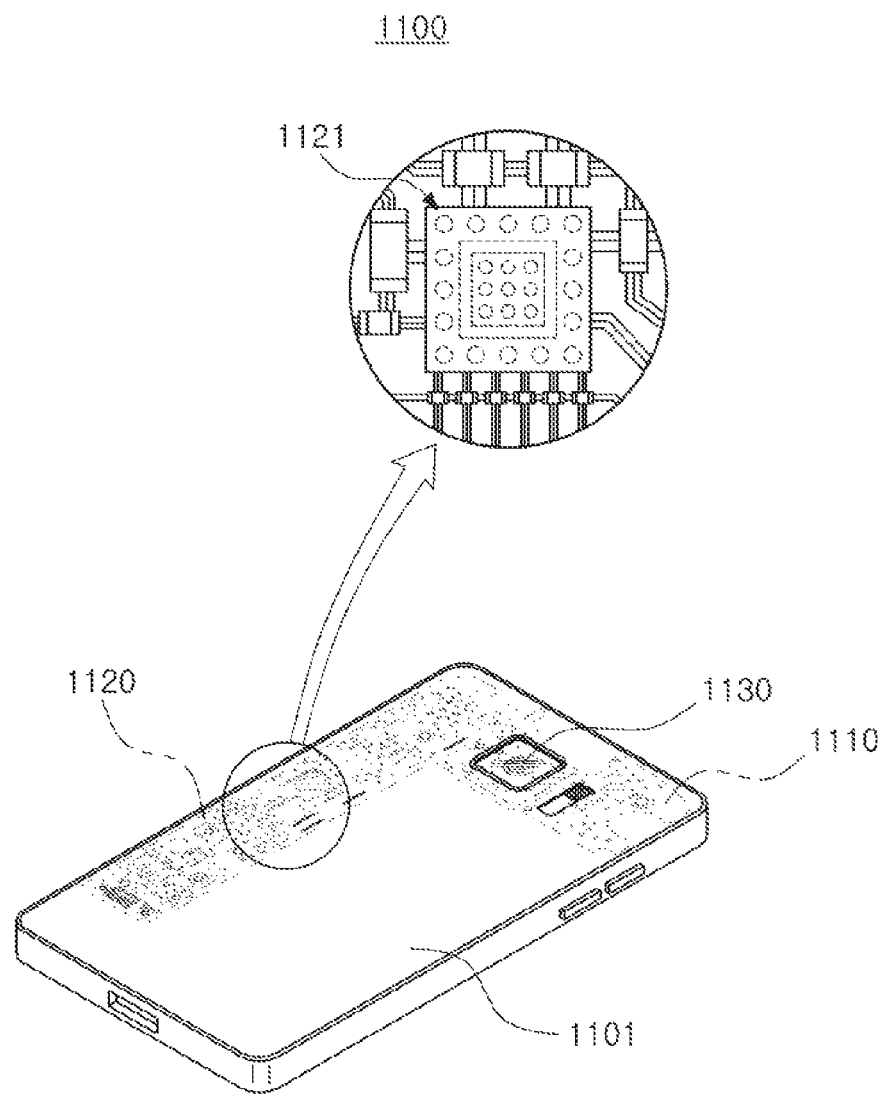
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
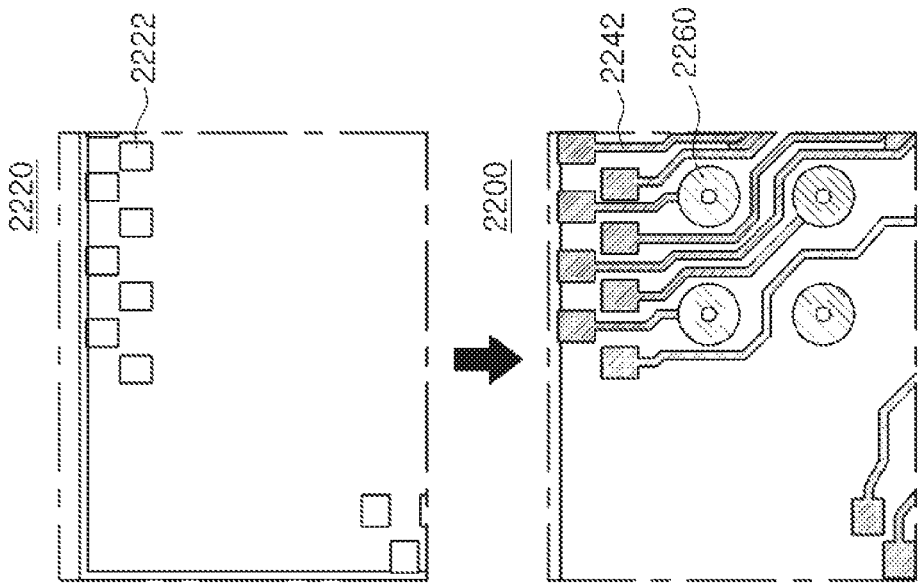
FIGS. 3A and 3B are schematic cross-sectional views illustrating states of a fan-in semiconductor package before and after being packaged.
Figure 3A:
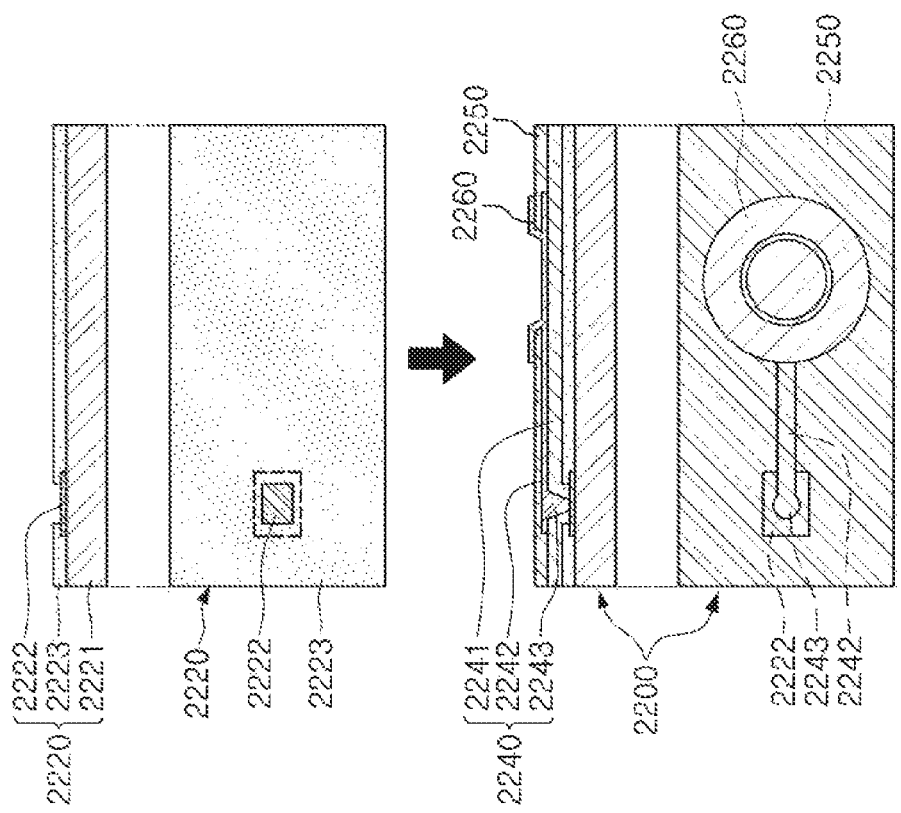

FIGS. 3A and 3B are schematic cross-sectional views illustrating states of a fan-in semiconductor package before and after being packaged.

Figure 4:
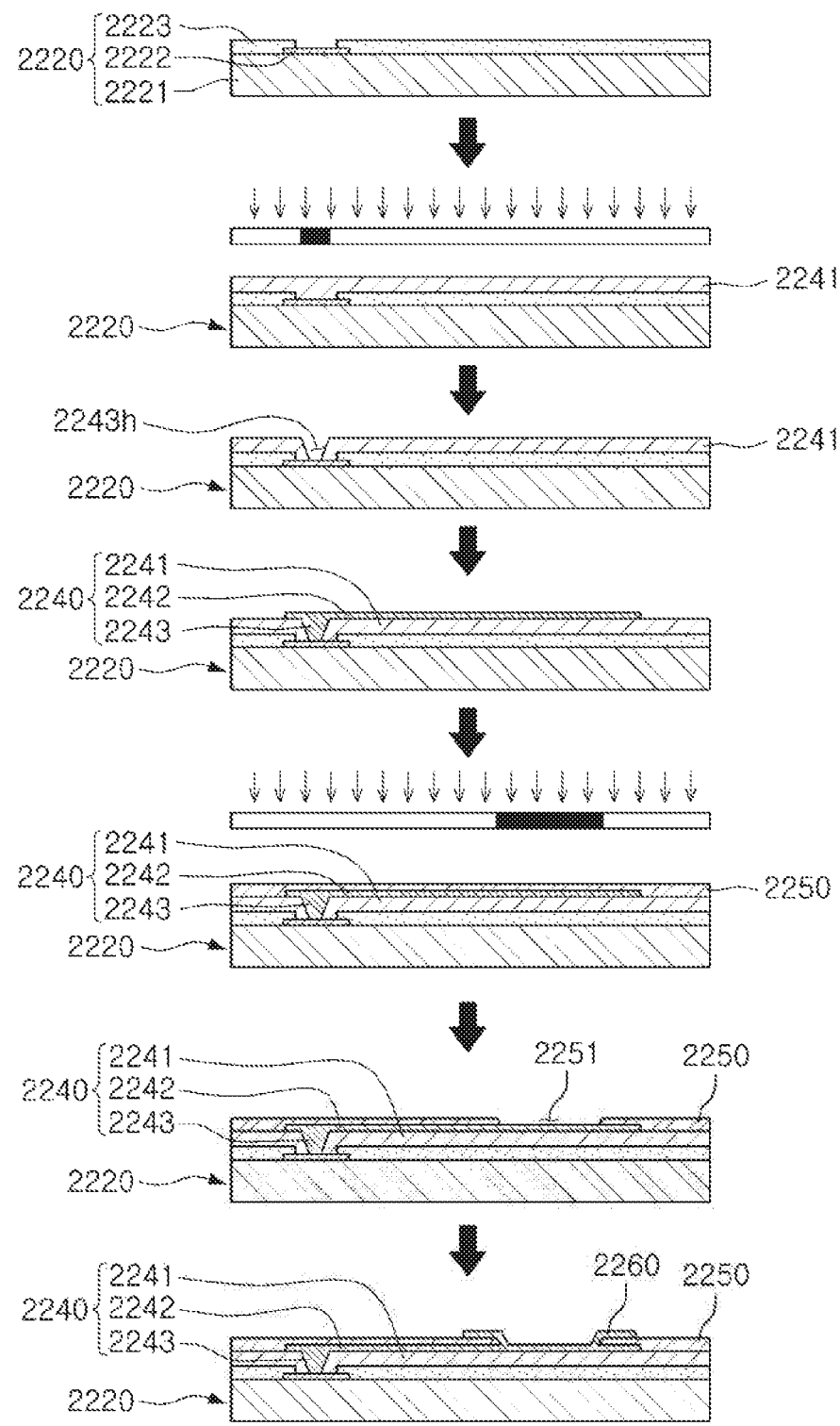
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a first connection member 2240 may be formed depending on a size of the semiconductor chip 2220 on the semiconductor chip 2220 in order to redistribute the connection pads 2222. The first connection member 2240 may be formed by forming an insulating layer 2241 on the semiconductor chip 2220 using an insulating material such as a photoimagable dielectric (PID) resin, forming via holes 2243h exposing the connection pads 2222, and then forming wiring patterns 2242 and vias 2243. Then, a passivation layer 2250 protecting the first connection member 2240 may be formed, an opening 2251 may be formed, and an under-bump metal layer 2260, or the like, may be formed. That is, a fan-in semiconductor package 2200 including, for example, the semiconductor chip 2220, the first connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
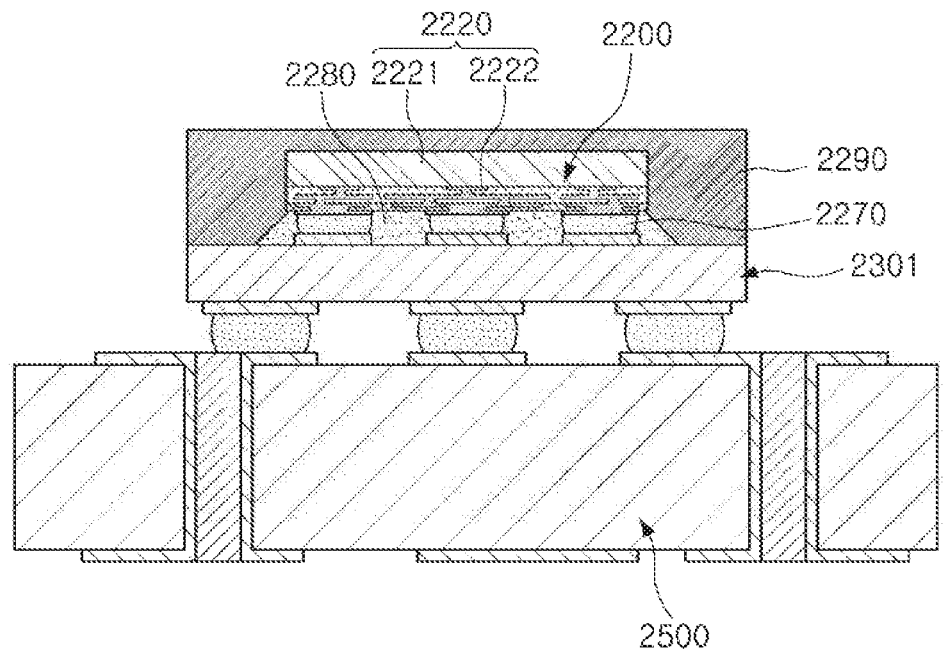
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
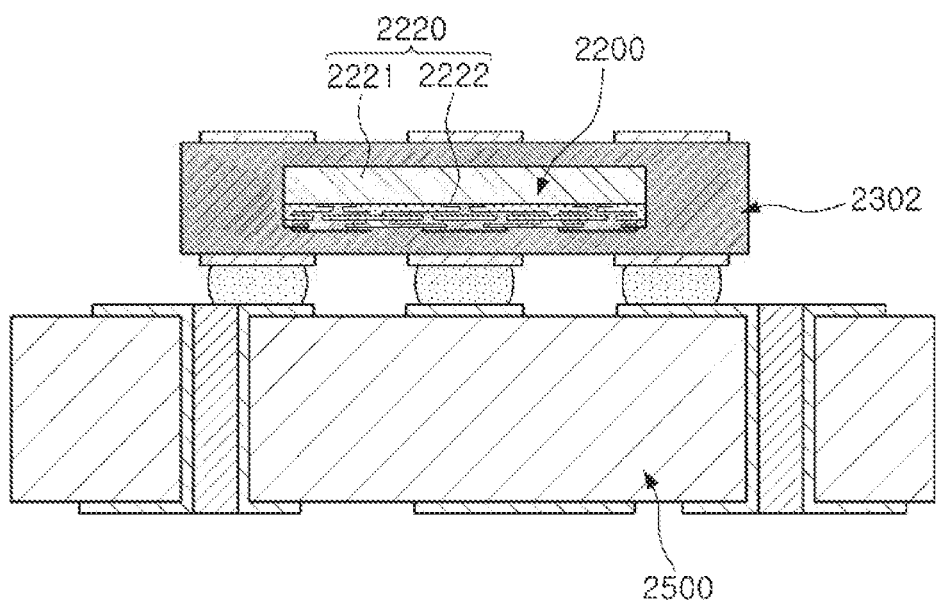
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
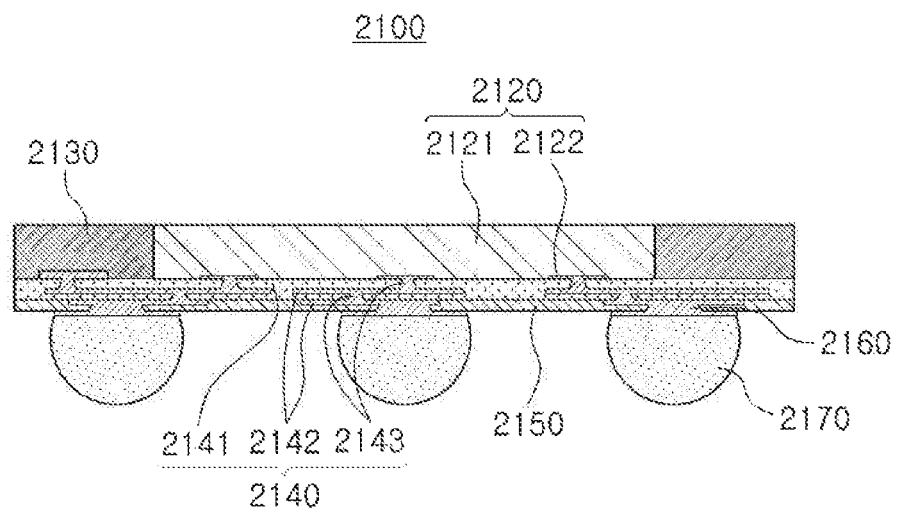
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a first connection member 2140. In this case, a passivation layer 2150 may further be formed on the first connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The first connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the first connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the first connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
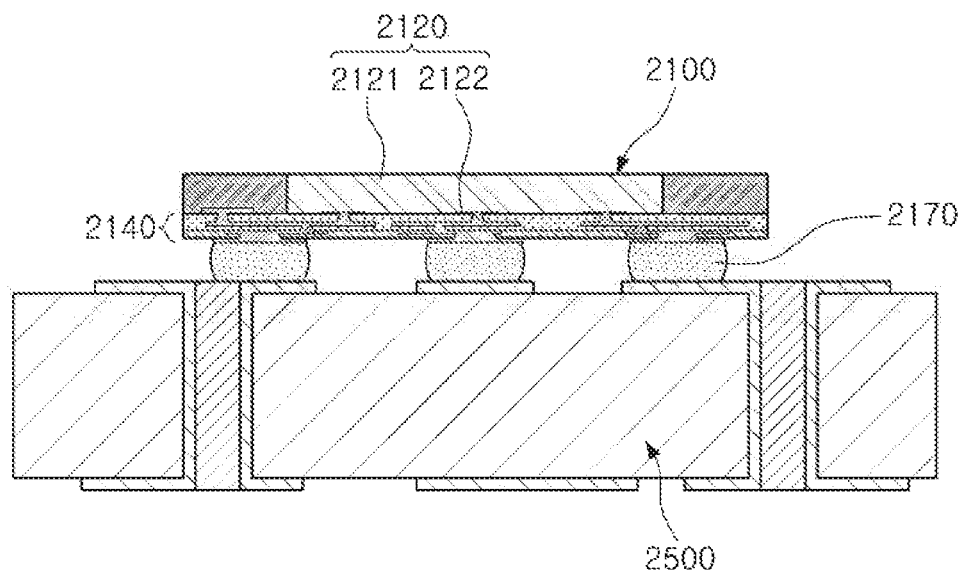
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the first connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A subminiature, ultra-thin fan-out sensor package having an optical-type fingerprint recognition function using such a package technology will hereinafter be described with reference to the drawings.

Figure 9:
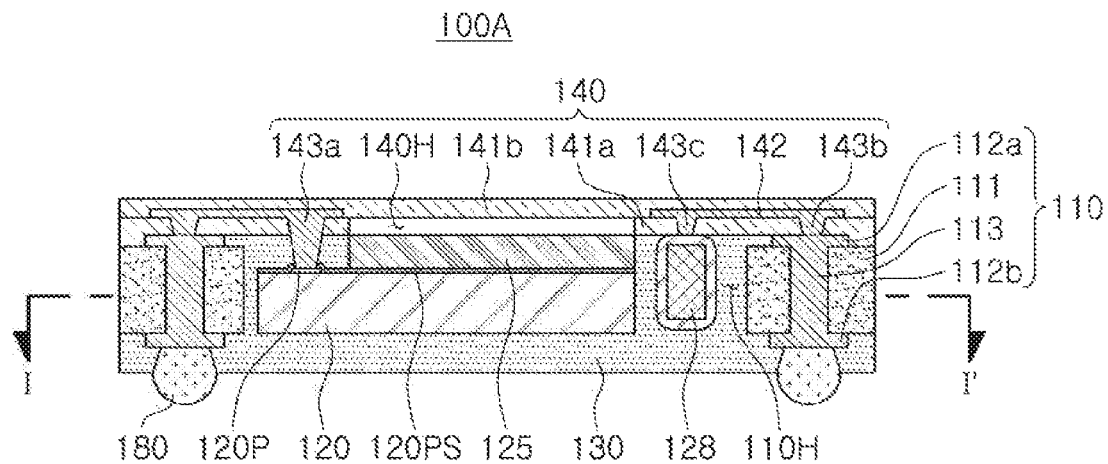
FIG. 9 is a schematic cross-sectional view illustrating an example of a fan-out sensor package.

FIG. 9 is a schematic cross-sectional view illustrating an example of a fan-out sensor package.

Figure 10:
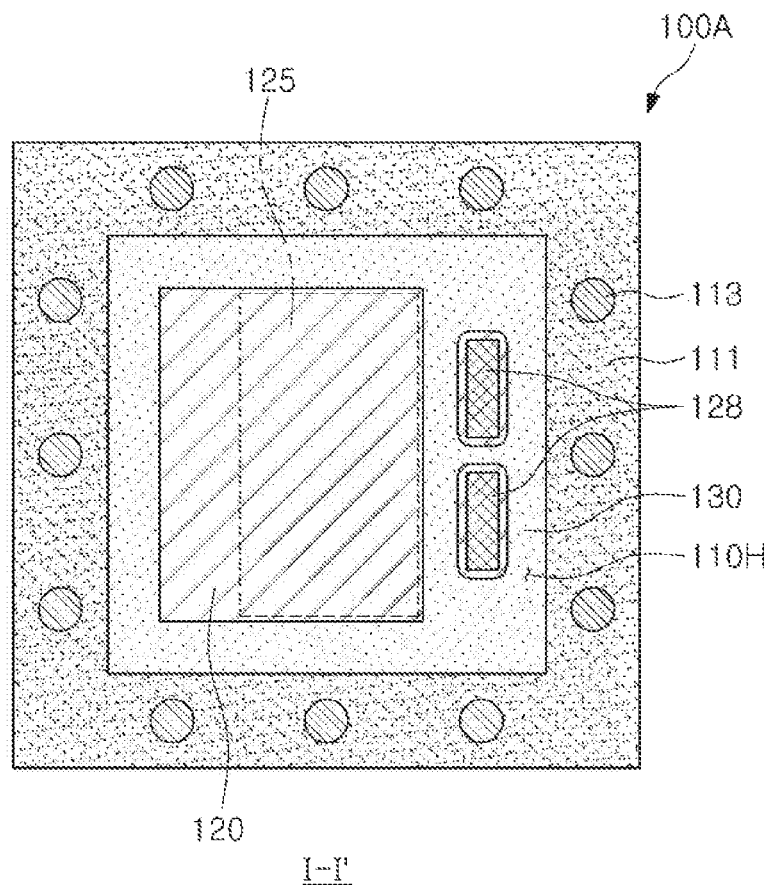
FIG. 10 is a schematic plan view taken along line I-I' of the fan-out sensor package of FIG. 9.

FIG. 10 is a schematic plan view taken along line I-I' of the fan-out sensor package of FIG. 9.

Referring to FIGS. 9 and 10, a fan-out sensor package 100A according to an exemplary embodiment in the present disclosure may include a first connection member 110 having a through-hole 110H, a sensor chip 120 disposed in the through-hole 110H of the first connection member 110 and having an active surface having connection pads 120P disposed thereon and an inactive surface opposing the active surface, an optical lens 125 disposed in the through-hole 110H and attached to the active surface of the sensor chip 120, an encapsulant 130 encapsulating at least portions of the first connection member 110, the sensor chip 120, and the optical lens 125, and a second connection member 140 disposed on the first connection member 110, the active surface of the sensor chip 120, and the optical lens 125. The first connection member 110 may include wiring layers 112a and 112b. The second connection member 140 may include a first insulating layer 141a disposed on the first connection member 110, the active surface of the sensor chip 120, and the optical lens 125, a redistribution layer 142 disposed on the first insulating layer 141a, and a second insulating layer 141b disposed on the first insulating layer 141a and covering the redistribution layer 142. The redistribution layer 142 may electrically connect a first wiring layer 112a and the connection pads 120P to each other. The first insulating layer 141a may have a cavity 140H exposing at least a portion of one surface of the optical lens 125. The cavity 140H may be covered with the second insulating layer 141b, and an upper portion of the cavity 140H may thus be closed. The second insulating layer 141b may be spaced apart from the optical lens 125 exposed by the first insulating layer 141a.

In a structure of a sensor package according to the related art, a BGA substrate is generally used. For example, the sensor package according to the related art has a form in which a sensor chip is disposed on the BGA substrate, is electrically connected to the BGA substrate by bonding wires, and is then molded by a molding material. However, in this structure, a structure of the sensor package becomes complicated, and a size and a thickness of the sensor package are increased, due to the bonding wires disposed on the BGA substrate and the sensor chip, an optical lens separately disposed on the sensor chip, or the like. In addition, it is difficult to control a mold thickness, such that a complicated molding process is required. In addition, warpage of the sensor package greatly occurs due to an asymmetrical structure, such that a sensitivity of fingerprint sensing is decreased, and a yield at the time of mounting the sensor package on a circuit board, or the like, is decreased. In addition, the warpage of the sensor package generates a difficulty in stacking an infrared cut filter and a metal shield in a process of manufacturing the sensor package in a module form.

On the other hand, the fan-out sensor package 100A according to the exemplary embodiment may have a structure in which the first connection member 110 having the wiring layers 112a and 112b is introduced instead of the BGA substrate, the sensor chip 120 having the connection pads 120P and an optical-type fingerprint recognition function and the optical lens 125 are disposed in the through-hole 110H of the first connection member 110 and are then encapsulated with the encapsulant 130, and the connection pads 120P of the sensor chip 120 are electrically connected to the wiring layers 112a and 112b of the first connection member 110 using the second connection member 140 having the redistribution layer 142 and vias 143a and 143b. Therefore, a size and a thickness of the fan-out semiconductor package 100A may be significantly decreased as compared to a structure of an optical-type fingerprint sensor package according to the related art. Resultantly, a sensing distance between the fan-out sensor package and a touch panel may be significantly decreased, such that a sensing sensitivity may be improved. Further, in the fan-out sensor package 100A according to the exemplary embodiment, warpage of the fan-out sensor package 100A may be controlled by the first connection member 110 and the encapsulant 130, and a defect due to the warpage of the fan-out sensor package 100A may thus be significantly decreased. For example, a thickness and a material of the first connection member 110 may be utilized to give rigidity required for the fan-out sensor package 100A, and the encapsulant 130 may be used to implement an approximately symmetrical structure to the insulating layers 141a and 141b between which the redistribution layer 142 is formed while protecting the sensor chip 120, thereby controlling the warpage of the fan-out sensor package 100A.

Meanwhile, in the fan-out sensor package 100A according to the exemplary embodiment, the cavity 140H exposing at least a portion of one surface of the optical lens 125 may be formed in the first insulating layer 141a of the second connection member 140. The cavity 140H may be covered with the second insulating layer 141b, and the upper portion of the cavity 140H may thus be closed. When one surface of the optical lens 125 is covered with an insulating material, a transmissivity is decreased, such that an optical recognition rate is decreased. When an optical recognition region is simply opened, the optical recognition rate may be improved, but it is likely that the optical recognition region will be damaged due to external impact. On the other hand, when the cavity 140H is formed in only the first insulating layer 141a and is covered with the second insulating layer 141b as in the fan-out sensor package 100A according to the exemplary embodiment, a light transmissivity may be improved, and the optical recognition region may be protected from the external impact.

Particularly, in the fan-out sensor package 100A according to the exemplary embodiment, the cavity 140H formed in the first insulating layer 141a is not covered with a separate flat layer such as a glass, but may be covered with the second insulating layer 141b, which is a polymer layer including an insulating resin. Therefore, a separate adhesive layer is not required, a process cost and a material cost of the fan-out sensor package 100A may be decreased, and a thickness of the fan-out sensor package 100A may further be decreased. In addition, since the polymer layer is used as the outermost layer, flexible characteristics may also be implemented, such that the fan-out sensor package 100A may be used in a foldable mobile phone, or the like.

The respective components included in the fan-out sensor package 100A according to the exemplary embodiment will hereinafter be described below in more detail.

The first connection member 110 may maintain rigidity of the fan-out sensor package 100A depending on certain materials, and serve to secure uniformity of a thickness of the encapsulant 130. The connection pads 120P of the sensor chip 120 may be electrically connected to the mainboard of the electronic device through electrical connection structures 180, or the like, by the first connection member 110. The first connection member 110 may include a plurality of wiring layers 112a and 112b to effectively redistribute the first connection pads 120P of the sensor chip 120, and may provide a wide wiring design region to suppress redistribution layers from being formed in other regions. The sensor chip 120 may be disposed in the through-hole 110H to be spaced apart from the first connection member 110 by a predetermined distance. Side surfaces of the sensor chip 120 may be surrounded by the first connection member 110, but are not limited thereto.

The first connection member 110 may include an insulating layer 111, a first wiring layer 112a disposed on an upper surface of the insulating layer 111, a second wiring layer 112b disposed on a lower surface of the insulating layer 111, and vias 113 penetrating through the insulating layer 111 and electrically connecting the first and second wiring layers 112a and 112b to each other. The first connection member 110 may include a larger number of insulating layers, if necessary. In this case, the first connection member 110 may include larger numbers of wiring layers and vias. For example, the wiring layer may be disposed between the plurality insulating layers.

For example, a material including an inorganic filler and an insulating resin may be used as a material of the insulating layer 111. For example, a thermosetting resin such as an epoxy resin, a thermoplastic resin such as a polyimide resin, or a resin including a reinforcing material such as an inorganic filler, for example, silica, alumina, or the like, more specifically, Ajinomoto Build up Film (ABF), FR-4, Bismaleimide Triazine (BT), a photoimagable dielectric (PID) resin, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may also be used. If necessary, a flexible copper clad laminate (FCCL) may be used, or a glass plate, a ceramic plate, a metal plate, or the like, may be used.

The wiring layers 112a and 112b may include a conductive material such as copper (Cu), aluminum (Al), silver (Ag), tin (Sn), gold (Au), nickel (Ni), lead (Pb), titanium (Ti), or alloys thereof. The wiring layers 112a and 112b may perform various functions depending on designs of corresponding layers. For example, the wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a and 112b may include pad patterns for vias, pad patterns for electrical connection structures, and the like. A thickness of each of the wiring layers 112a and 112b may be greater than that of the redistribution layer 142. The redistribution layer 142 may be formed by a fine semiconductor process, or the like, for the purpose of thinness, a fine pitch, and the like. Therefore, the redistribution layer 142 may have a thickness smaller than those of the wiring layers 112a and 112b.

The vias 113 may penetrate through the insulating layer 111 and electrically connect the first wiring layer 112a and the second wiring layer 112b to each other. A material of each of the vias 113 may be a conductive material. Each of the vias 113 may be completely filled with the conductive material, or the conductive material may be formed along a wall of each of via holes. Each of the vias 113 may be a through-via completely penetrating through the insulating layer 111, and may have a cylindrical shape or a hourglass shape, but is not limited thereto. When the insulating layer 111 includes a plurality of layers, each of the vias 113 may also include a plurality of layers.

The sensor chip 120 may include an image sensor chip such as a complementary metal oxide semiconductor (CMOS) image sensor (CIS), but is not limited thereto. The sensor chip 120 may be a die formed on the basis of an active wafer. In this case, a base material of a body may be silicon (Si), germanium (Ge), gallium arsenide (GaAs), or the like. Various circuits may be formed on the body. The die may include a sensor and a controller. The connection pads 120P may electrically connect the sensor chip 120 to other components. A material of each of the connection pads 120P may be a conductive material such as aluminum (Al), or the like. The active surface of the sensor chip 120 refers to a surface of the sensor chip 120 on which the connection pads 120P are disposed. A passivation layer 120PS covering at least portions of the connection pads 120P may be formed on the body, if necessary. The passivation layer 120PS may be an oxide film, a nitride film, or the like, or be a double layer of an oxide layer and a nitride layer. In addition, a photosensitive polyimide layer (not illustrated) may be disposed on the passivation layer 120PS, if necessary. An insulating layer (not illustrated), and the like, may also be further disposed in other required positions. The optical lens 125 may be attached to the active surface of the sensor chip 120. The optical lens 125 may be a lens of which optical characteristics such as a refractive index, a magnetic permeability, and the like, are designed within a desired range. A material of the optical lens 125 is not particularly limited, but may be, for example, a glass. However, the material of the optical lens 125 is not limited thereto. The optical lens 125 may be formed on the active surface of the sensor chip 120 on a wafer and be integrated with the sensor chip 120.

Passive components 128 may be disposed in the through-hole 110H of the first connection member 110, if necessary. The passive components 128 may be disposed side-by-side with the sensor chip 120 in the through-hole 110H. The passive components 128 may be electrically connected to the redistribution layer 142 through third vias 143c penetrating through at least portions of the insulating layers 141a and 141b. The sensor chip 120 and the passive components 128 may be electrically connected to each other through the redistribution layer 142. The passive component 128 may be any known passive component such as a capacitor, an inductor, a beads, or the like.

The encapsulant 130 may protect the sensor chip 120. An encapsulation form of the encapsulant 130 is not particularly limited, but may be a form in which the encapsulant 130 surrounds at least portions of the sensor chip 120. For example, the encapsulant 130 may cover at least portions of the first connection member 110 and the inactive surface of the sensor chip 120, and fill at least portions of spaces between walls of the through-hole 110H and the side surfaces of the sensor chip 120. In addition, the encapsulant 130 may also cover side surfaces of the optical lens 125. That is, the encapsulant 130 may cover the inactive surface and the side surfaces of the sensor chip 120, and cover at least portions of the active surface of the sensor chip 120. Certain materials of the encapsulant 130 are not particularly limited. For example, an insulating material may be used as the certain materials of the encapsulant 130. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may be used, or a photoimagable encapsulant (PIE) may be used. Meanwhile, a material and a thickness of the encapsulant 130 may be controlled so that the encapsulant 130 is symmetrical to the insulating layers 141a and 141b in relation to the first connection member 110. In this case, warpage of the fan-out sensor package 100A may be more effectively controlled.

The second connection member 140 may redistribute the connection pads 120P of the sensor chip 120. In addition, the second connection member 140 may electrically connect the connection pads 120P of the sensor chip 120 to the wiring layers 112a and 112b of the first connection member 110. Several tens to several hundreds of connection pads 120P of the sensor chip 120 having various functions may be redistributed by the second connection member 140, and may be physically or electrically externally connected through the electrical connection structures 180 depending on the functions. The second connection member 140 may include insulating layers, redistribution layers, and via layers more than those illustrated in the drawing. However, in any case, a cavity may be formed in at least one of the insulating layers.

The insulating layers 141a and 141b may be used as build-up layers for forming the redistribution layer 142. In addition, the insulating layers 141a and 141b may protect the redistribution layer 142. A material of each of the insulating layers 141a and 141b may be an insulating resin. In this case, a photosensitive insulating resin such as a PID resin may also be used as the insulating resin. This case may be advantageous in forming fine patterns. When the insulating layers 141a and 141b are multiple layers, the materials of the insulating layers 141a and 141b may be the same as each other, and may also be different from each other, if necessary. When the insulating layers 141a and 141b are the multiple layers, the insulating layers 141a and 141b may be integrated with each other depending on a process, such that a boundary therebetween may also not be apparent. The cavity 140H exposing at least a portion of one surface of the optical lens 125 may be formed in the first insulating layer 141a. The cavity 140H may be covered with the second insulating layer 141b, and the upper portion of the cavity 140H may thus be closed. To this end, the second insulating layer 141b may have a film form. A thickness of the cavity 140H may be 1 μm to 100 μm, and may be changed depending on an application.

The redistribution layer 142 may serve to substantially redistribute the connection pads 120P, and may serve to electrically connect the connection pads 120P to the wiring layers 112a and 112b, the passive components 128, or the like. A material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on a design of a corresponding layer. For example, the redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 142 may include various pad patterns, and the like.

The vias 143a, 143b, and 143c may electrically connect the connection pads 120P, the redistribution layer 142, the first wiring layer 112a, and the like, formed on different layers to each other, resulting in an electrical path in the fan-out sensor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with the conductive material, or the conductive material may also be formed along a wall of each of the vias. In addition, each of the vias 143a, 143b, and 143c may have any shape known in the related art, such as a tapered shape, a cylindrical shape, and the like. Meanwhile, since the optical lens 125 is disposed between the active surface of the sensor chip 120 and the insulating layers 141a and 141b, the active surface of the sensor chip 120 and the insulating layers 141a and 141b may have a step therebetween. Therefore, first vias 143a electrically connecting the redistribution layer 142 and the connection pads 120P to each other may penetrate through at least portions of the encapsulant 130 as well as the insulating layers 141a and 141b. On the other hand, second vias 143b electrically connecting the redistribution layer 142 and the first wiring layer 112a to each other may penetrate through only at least portions of the insulating layers 141a and 141b. That is, the first via 143a may have a height greater than that of the second via 143b.

Openings exposing at least portions of the second wiring layer 112b may be formed in a lower surface of the encapsulant 130, and the electrical connection structures 180 may be disposed in the openings. The electrical connection structure 180 may be additionally configured to physically or electrically externally connect the fan-out sensor package 100A. For example, the fan-out sensor package 100A may be mounted on the mainboard of the electronic device through electrical connection structures 180. Underbump metal layers (not illustrated) connected to the exposed second wiring layer 112b may be formed in the openings formed in the lower surface of the encapsulant 130, if necessary, and the electrical connection structures 180 may be connected to the underbump metal layers (not illustrated).

Each of the electrical connection structures 180 may be formed of a conductive material, for example, a solder, or the like. However, this is only an example, and a material of each of the electrical connection structures 180 is not particularly limited thereto. Each of the electrical connection structures 180 may be a land, a ball, a pin, a bump, or the like. The electrical connection structures 180 may be formed as a multilayer or single layer structure. When the electrical connection structures 180 are formed as a multilayer structure, the electrical connection structures 180 may include a copper (Cu) pillar and a solder. When the electrical connection structures 180 are formed as a single layer structure, the electrical connection structures 180 may include a tin-silver solder or copper (Cu). However, this is only an example, and the electrical connection structures 180 are not limited thereto. The number, an interval, a disposition form, and the like, of electrical connection structures 180 are not particularly limited, but may be sufficiently modified depending on design particulars by those skilled in the art. For example, the electrical connection structures 180 may be provided in an amount of several tens to several thousands according to the number of connection pads 120P of the sensor chip 120, or may be provided in an amount of several tens to several thousand or more or several tens to several thousand or less. At least one of the electrical connection structures 180 may be disposed in a fan-out region. The fan-out region refers to a region except for a region in which the sensor chip 120 is disposed. That is, the fan-out sensor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Meanwhile, although not illustrated in the drawings, a metal layer may further be disposed on the wall of the through-hole 110H, if necessary. The metal layer (not illustrated) may serve to effectively dissipate heat generated from the sensor chip 120. In addition, the metal layer may also serve to shield electromagnetic waves. In addition, a separate semiconductor chip (not illustrated) having a function that is the same as or different from that of the sensor chip 120, for example, a boost IC, a control IC, or the like, may be disposed in the through-hole 110H, if necessary. In addition, the number of through-holes 110H may be plural, if necessary, and the abovementioned semiconductor chips or passive components may be disposed in the through-holes 110H, respectively. Alternatively, the abovementioned semiconductor chips or passive components may be disposed in the first connection member 110.

FIGS. 11A through 11D are schematic views illustrating an example of processes of manufacturing the fan-out sensor package of FIG. 9.

Figure 11A:
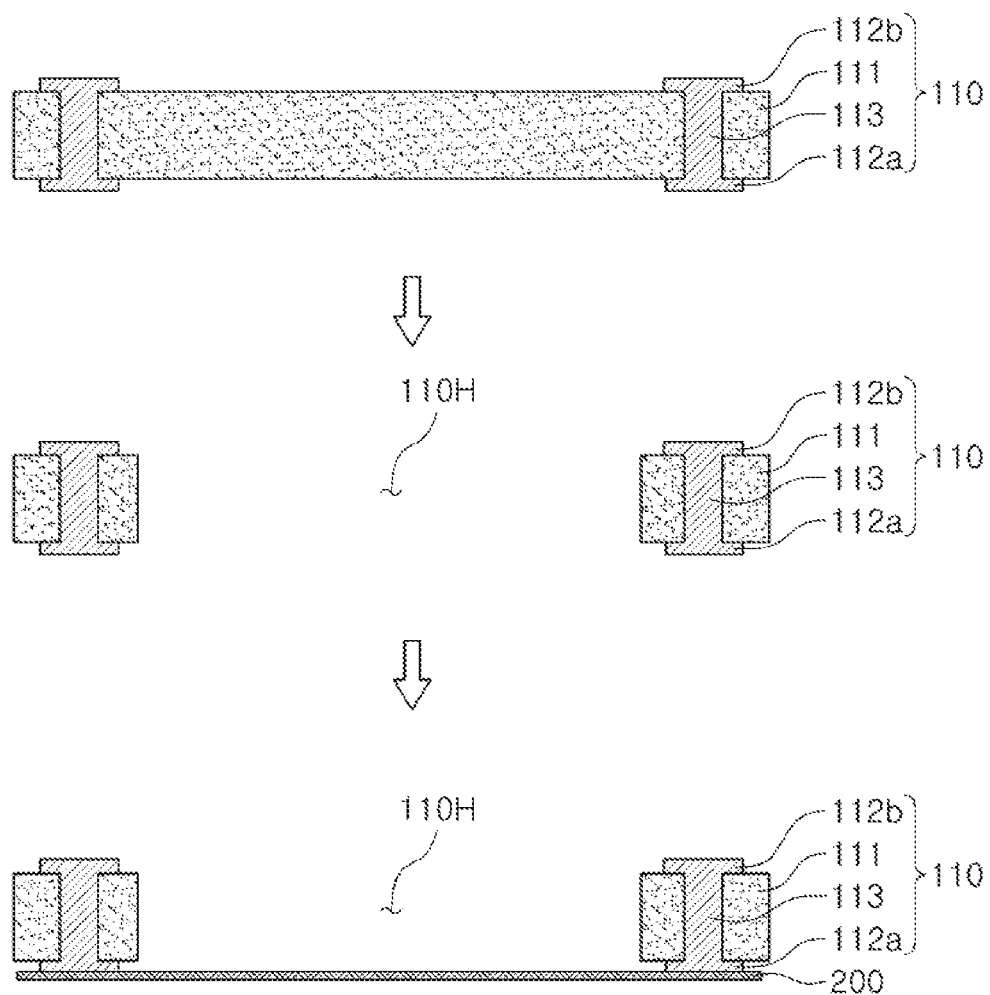
FIGS. 11A through 11D are schematic views illustrating an example of processes of manufacturing the fan-out sensor package of FIG. 9.

Referring to FIG. 11A, the first connection member 110 may be first manufactured. The first connection member 110 may be manufactured, for example, by preparing a material such as a copper clad laminate (CCL), or the like, as a material of the insulating layer 111, forming via holes in the insulating layer 111, and then forming the wiring layers 112a and 112b and the vias 113 by any known plating method. Then, the through-hole 110H may be formed in the first connection member 110. The through-hole 110H may be formed using a laser drill and/or a mechanical drill, but is not limited thereto. Meanwhile, the through-hole 110H of the first connection member 110 may also be formed when the via holes are formed, if necessary. Then, a tape 200 may be attached on a lower surface of the first connection member 110. A material of the tape 200 is not particularly limited, but may be any material that is attachable and detachable.

Figure 11B:
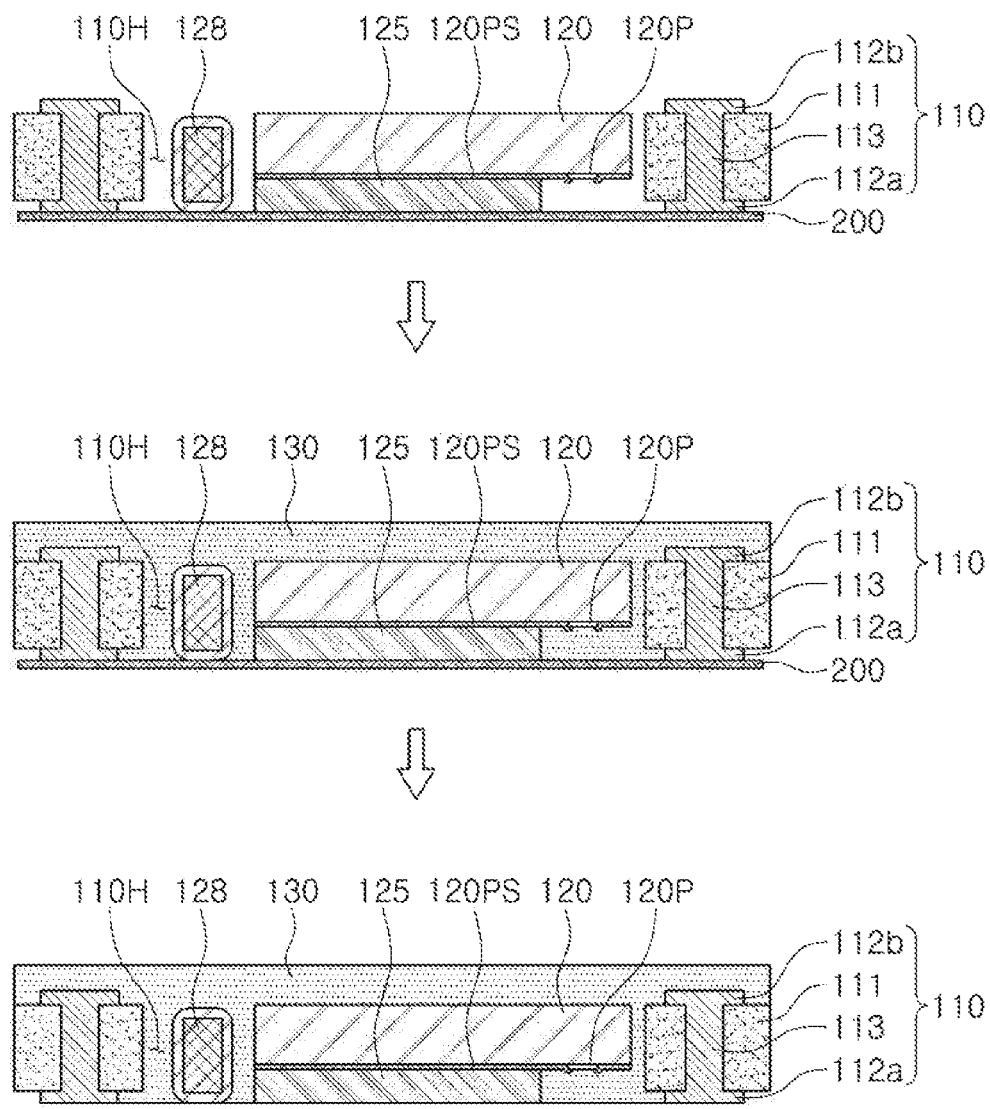

Then, referring to FIG. 11B, the sensor chip 120 to which the optical lens 125 is attached may be disposed in the through-hole 110H of the first connection member 110. This process may be performed by disposing the sensor chip 120 in a face-down form so that the optical lens 125 is attached to the tape 200. Then, at least portions of the first connection member 110, the sensor chip 120, and the optical lens 125 may be encapsulated with the encapsulant 130. Meanwhile, the encapsulation may be performed by laminating a film for forming the encapsulant 130 in a b-stage and hardening the film or by applying a liquid-phase material for forming the encapsulant 130 and hardening the liquid-phase material, but is not limited thereto.

Figure 11C:
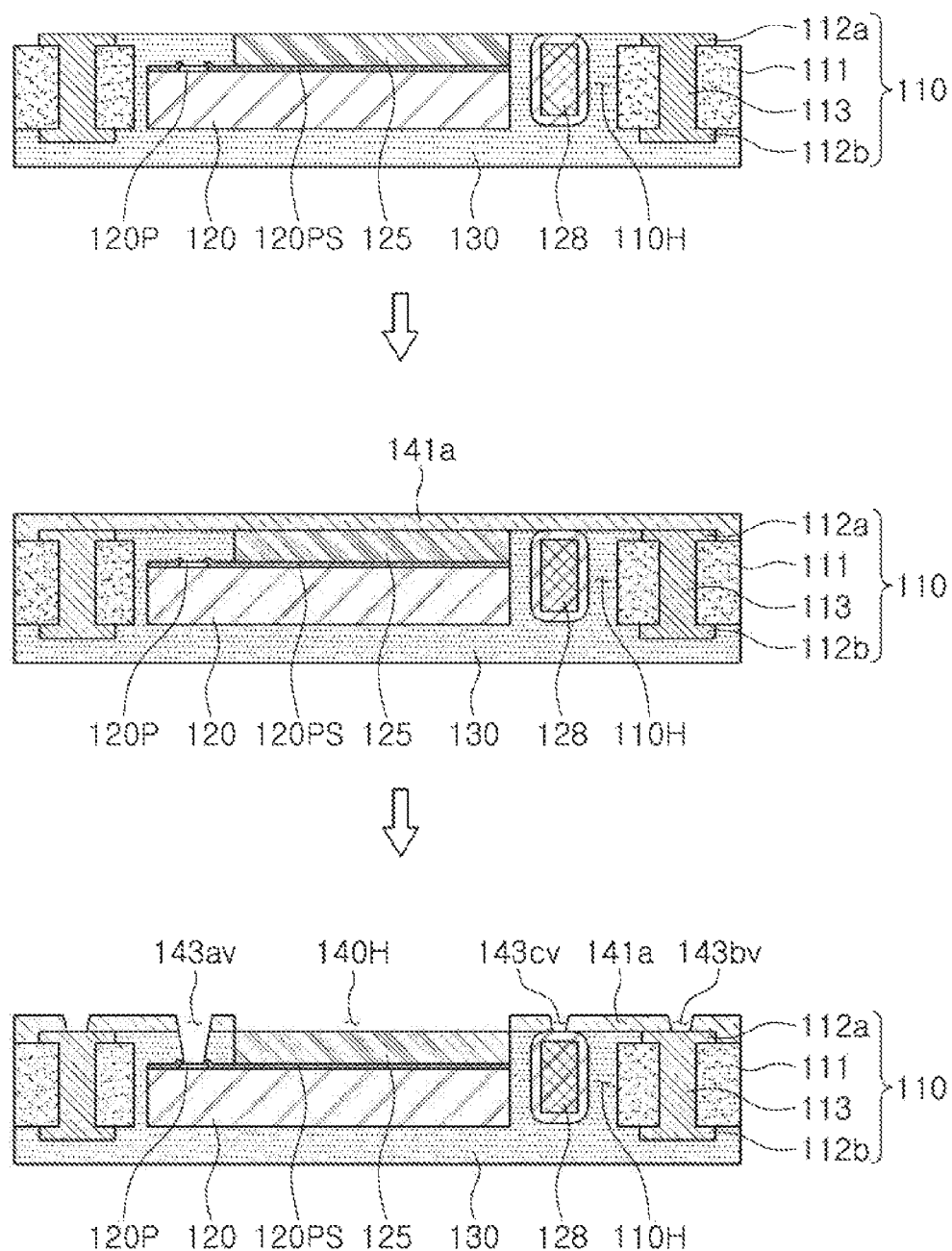

Then, referring to FIG. 11C, a panel manufactured up to now may be overturned. Then, the first insulating layer 141a covering the optical lens 125 may be formed on the active surface of the sensor chip 120. The first insulating layer 141a may be formed by any known lamination method or coating method. Then, first via holes 143av penetrating through at least portions of the first insulating layer 141 and the encapsulant 130 and second and third via holes 143bv and 143cv penetrating through only at least portions of the first insulating layer 141a may be formed. The via holes 143av, 143bv, and 143cv may be formed by any known photolithography method or using a mechanical drill and/or a laser drill depending on materials of the first insulating layer 141a and the encapsulant 130. If necessary, a combination of them may also be used. When the via holes 143av, 143bv, and 143cv are formed, the cavity 140H may also be formed. The cavity 140H may also be formed by any known photolithography method or using a mechanical drill and/or a laser drill depending on the material of the first insulating layer 141a.

Figure 11D:
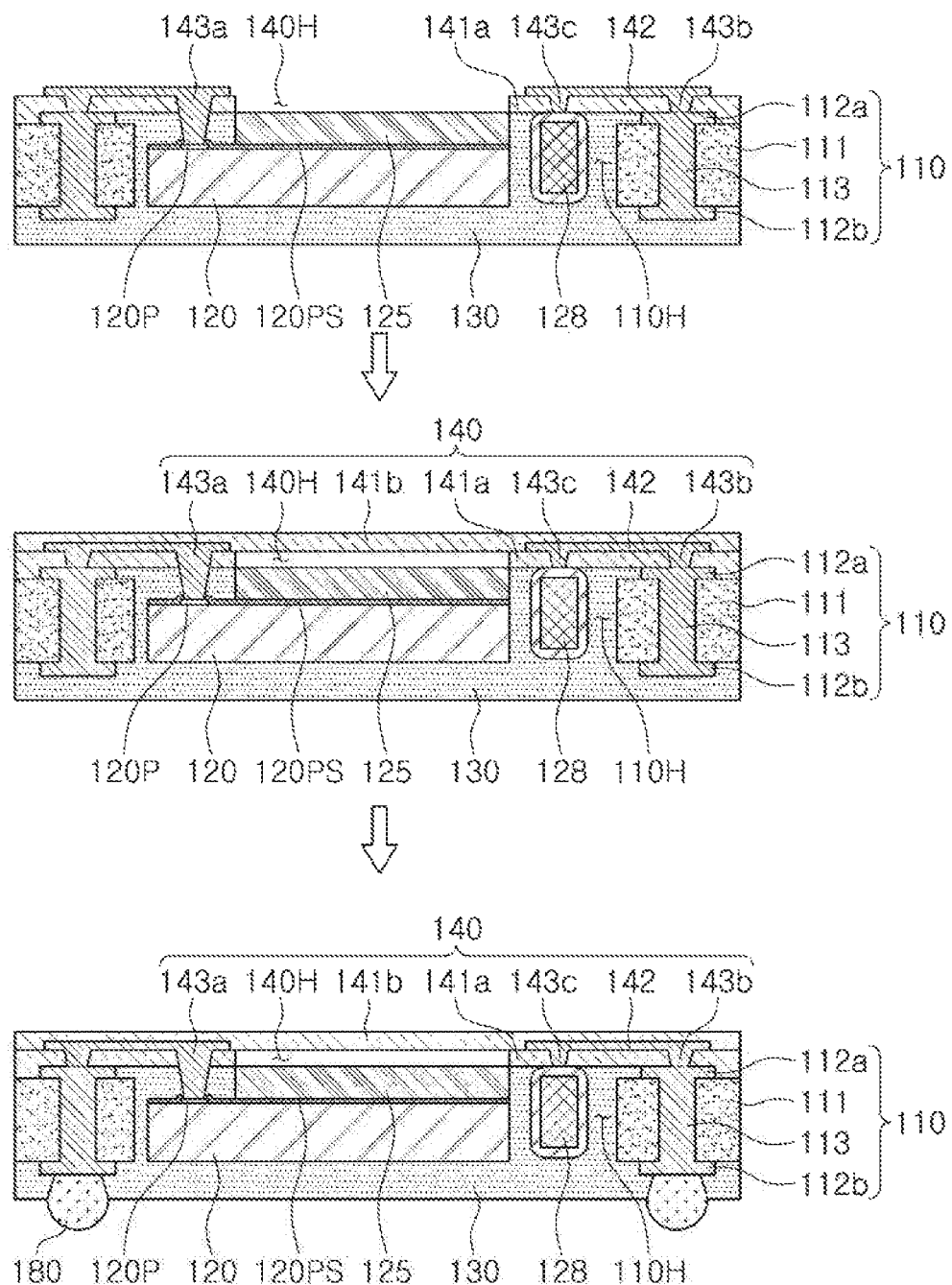

Then, referring to FIG. 11D, the vias 143a, 143b, and 143c and the redistribution layer 142 may be formed. The vias 143a, 143b, and 143c and the redistribution layer 142 may be formed by any known plating process. Then, the second insulating layer 141b may be formed on the first insulating layer 141a. The second insulating layer 141b may be formed by laminating a film form, exposing and developing the film form to close an upper portion of the cavity 140H, and performing a hard bake process on the film form. Then, the openings exposing at least portions of the second wiring layer 112b of the first connection member 110 may be formed in the lower surface of the encapsulant 130, and the electrical connection structures 180 may be formed in the openings.

Figure 12:
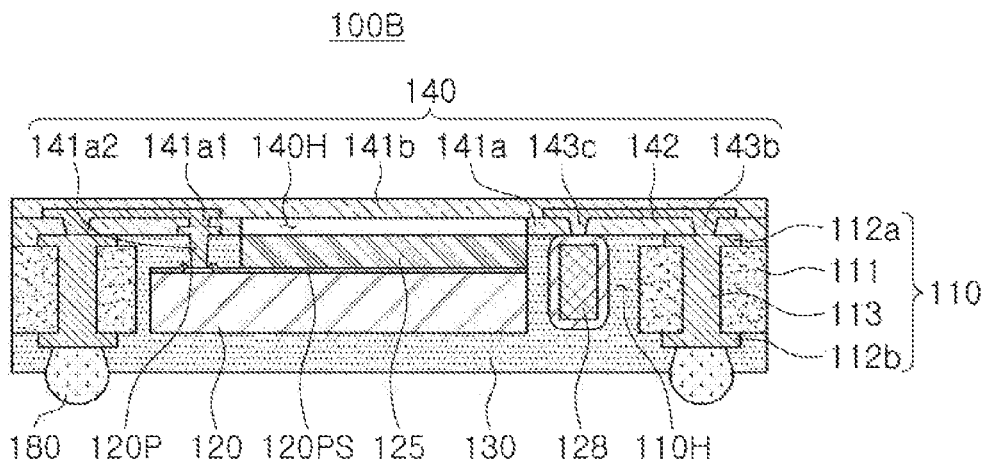
FIG. 12 is a schematic cross-sectional view illustrating another example of a fan-out sensor package.

FIG. 12 is a schematic cross-sectional view illustrating another example of a fan-out sensor package.

Referring to FIG. 12, in a fan-out sensor package 100B according to another exemplary embodiment in the present disclosure, a first via 143a1 and 143a2 may include a plurality of layers. That is, the first via 143a1 and 143a2 may include a fourth via 143a1 penetrating through at least portions of insulating layers 141a and 141b and a fifth via 143a2 penetrating through at least a portion of an encapsulant 130. The fourth via 143a1 and the fifth via 143a2 may be connected to each other through a via pad disposed on the encapsulant 130. A description of other configurations and a manufacturing method overlaps that described above, and is thus omitted.

Figure 13:
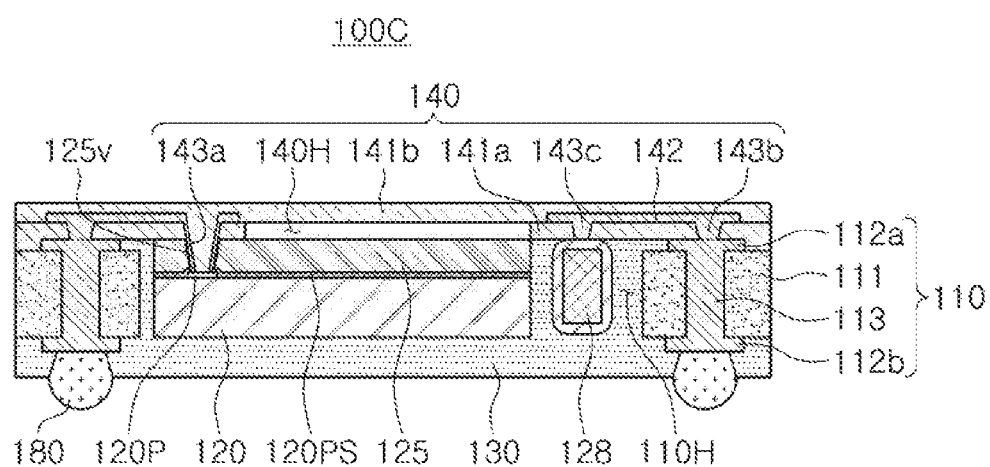
FIG. 13 is a schematic cross-sectional view illustrating another example of a fan-out sensor package.

FIG. 13 is a schematic cross-sectional view illustrating another example of a fan-out sensor package.

Referring to FIG. 13, in a fan-out sensor package 100C according to another exemplary embodiment in the present disclosure, a sensor chip 120 and an optical lens 125 may have substantially the same size. In this case, a trench 125v may be formed in the optical lens 125 to allow first vias 143a to penetrate through the optical lens 125 rather than an encapsulant 130 and be connected to connection pads 120P of the sensor chip 120. That is, a redistribution layer 142 may be electrically connected to the connection pads 120P through the first vias 143a penetrating through at least portions of insulating layers 141a and 141b and the optical lens 125. Meanwhile, when the sensor chip 120 and the optical lens 125 have substantially the same size, after the optical lens 125 is formed on the sensor chip 120 on a wafer, a separate additional cutting process may not be required, or a core portion or an e-bar structure may be removed or be significantly decreased. A description of other configurations and a manufacturing method overlaps that described above, and is thus omitted.

Figure 14:
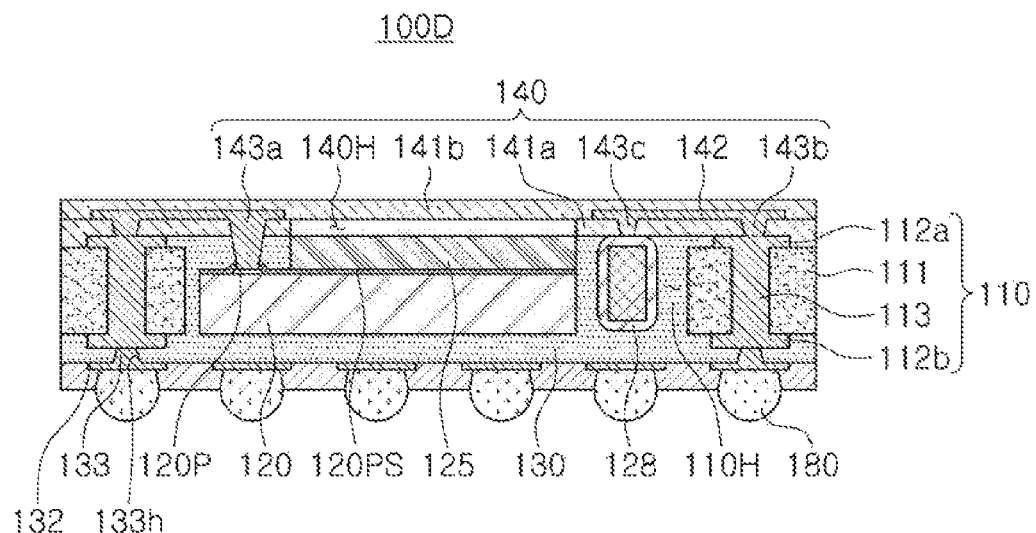
FIG. 14 is a schematic cross-sectional view illustrating another example of a fan-out sensor package.

FIG. 14 is a schematic cross-sectional view illustrating another example of a fan-out sensor package.

Referring to FIG. 14, a fan-out sensor package 100D according to another exemplary embodiment in the present disclosure may further include a backside redistribution layer 132 disposed on an encapsulant 130, backside vias 133 penetrating through at least portions of the encapsulant 130 and electrically connecting a second wiring layer 112b of a first connection member 110 and the backside redistribution layer 132 to each other, and a passivation layer 135 disposed on the encapsulant 130 and having openings 135h exposing at least portions of the backside redistribution layer 132. Electrical connection structures 180 may be formed in the openings 135h of the passivation layer 135h, and if necessary, underbump metal layers (not illustrated) may be formed in the openings 135 and the electrical connection structures 180 may be connected to the underbump metal layers (not illustrated). A fan-in region on the encapsulant 130 may be used as a routing region by forming the backside redistribution layer 132. Therefore, a larger number of electrical connection structures 180 may be formed. A description of other configurations and a manufacturing method overlaps that described above, and is thus omitted.

Figure 15:
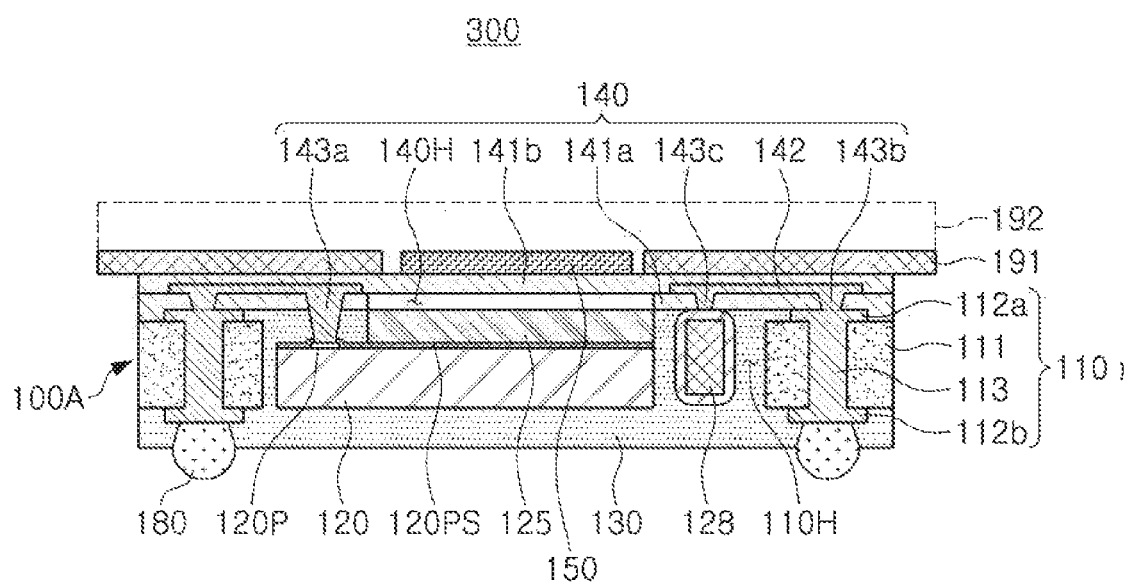
FIG. 15 is a schematic cross-sectional view illustrating an example of an optical-type fingerprint sensor module.

FIG. 15 is a schematic cross-sectional view illustrating an example of an optical-type fingerprint sensor module.

After forming the fan-out sensor package 100A shown in FIG. 11D, a metal shield 191 protecting a region in which an infrared cut filter 150 is not disposed may be disposed on the insulating layers 141a and 141b of the fan-out sensor package 100A according to the exemplary embodiment. In addition, a display panel 192 may be disposed on the metal shield 191. In this case, the fan-out sensor package 100A according to the exemplary embodiment may be modularized. That is, an optical-type fingerprint sensor module 300 may be provided. The metal shield 191 and the display panel 192 may be attached to each other using any known adhesive, or the like. The display panel 192 may be an organic light emitting diode (OLED) panel. Light emitted from the OLED panel 192 may pass through the infrared cut filter 150, the optical lens 125, and the like, and then arrive at the sensor chip 120. In this case, when a user's finger is recognized on the OLED panel 192, the sensor chip 120 may recognize an image of specific light transferred from the OLED panel 192 through the infrared cut filter 150 and the optical lens 125. Meanwhile, any one of the fan-out semiconductor packages 100B to 100D described above, instead of the fan-out semiconductor package 100A, may also be applied to the optical-type fingerprint sensor module 300.

As set forth above, according to the exemplary embodiments in the present disclosure, a subminiature, ultra-thin fan-out sensor package in which a structure may be simple, a warpage problem may be solved, an optical recognition rate may be excellent by opening an optical recognition region, and damage to the optical recognition region due to impact may be prevented, and an optical-type fingerprint sensor module including the same may be provided.

While exemplary embodiments have been shown and described above, it will be apparent to those skilled in the art that modifications and variations could be made without departing from the scope of the present invention as defined by the appended claims.

What is claimed is:

1. A fan-out sensor package comprising:
a first connection member having a through-hole and including a first wiring layer;
a sensor chip disposed in the through-hole and having an active surface having connection pads disposed thereon and an inactive surface opposing the active surface;
an optical lens disposed in the through-hole and attached to the active surface of the sensor chip;
an encapsulant encapsulating at least portions of the first connection member, the sensor chip, and the optical lens; and
a second connection member including a first insulating layer disposed on the first connection member, the active surface of the sensor chip, and the optical lens, a redistribution layer disposed on the first insulating layer, and a second insulating layer disposed on the first insulating layer and covering the redistribution layer,
wherein the redistribution layer electrically connects the first wiring layer and the connection pads,
the first insulating layer has a cavity exposing at least a portion of one surface of the optical lens, and
one side of the cavity is closed by the second insulating layer.

2. The fan-out sensor package of claim 1, wherein each of the first and second insulating layers is a polymer layer including an insulating resin.

3. The fan-out sensor package of claim 2, wherein the insulating resin is a photosensitive insulating resin.

4. The fan-out sensor package of claim 2, wherein the second insulating layers is an outmost layer of the fan-out sensor package.

5. The fan-out sensor package of claim 1, wherein the second insulating layer has a film form.

6. The fan-out sensor package of claim 1, wherein one surface of the first wiring layer and one surface of the optical lens are disposed on the same level.

7. The fan-out sensor package of claim 1, wherein the sensor chip includes an image sensor.

8. The fan-out sensor package of claim 7, wherein the sensor chip includes a complementary metal oxide semiconductor (CMOS) image sensor (CIS).

9. The fan-out sensor package of claim 1, wherein the redistribution layer is electrically connected to the connection pads through first vias penetrating through at least portions of the first insulating layer and the encapsulant, and is electrically connected to the first wiring layer through second vias penetrating through the first insulating layer, and the first via has a height greater than that of the second via.

10. The fan-out sensor package of claim 9, wherein the first via includes a third via penetrating through the first insulating layer and a fourth via penetrating through at least a portion of the encapsulant, and
the third and fourth vias are connected to each other by a via pad disposed on the encapsulant.

11. The fan-out sensor package of claim 1, wherein the redistribution layer is electrically connected to the connection pads through first vias penetrating through the first insulating layer and the optical lens, and is electrically connected to the first wiring layer through second vias penetrating through the first insulating layer, and
the first via has a height greater than that of the second via.

12. The fan-out sensor package of claim 1, wherein the first connection member includes an insulating layer, the first wiring layer disposed on one surface of the insulating layer, a second wiring layer disposed on the other surface of the insulating layer, and vias penetrating through the insulating layer and electrically connecting the first and second wiring layers to each other, and
the first and second wiring layers are electrically connected to the connection pads.

13. The fan-out sensor package of claim 12, further comprising:
a backside redistribution layer disposed on the encapsulant;
backside vias penetrating through at least portions of the encapsulant and electrically connecting the second wiring layer and the backside redistribution layer to each other; and
a passivation layer disposed on the encapsulant and having openings exposing at least portions of the backside redistribution layer.

14. The fan-out sensor package of claim 13, further comprising electrical connection structures disposed in the openings of the passivation layer and electrically connected to the exposed backside redistribution layer.

15. The fan-out sensor package of claim 1, further comprising a passive component disposed in the through-hole and electrically connected to the connection pads through the redistribution layer.

16. The fan-out sensor package of claim 1, wherein the encapsulant covers the inactive surface and side surfaces of the sensor chip, and covers at least portions of the active surface of the sensor chip.

17. The fan-out sensor package of claim 1, wherein the second insulating layer is spaced apart from the portion of the one surface of the optical lens exposed by the cavity.

18. An optical-type fingerprint sensor module comprising:
the fan-out sensor package of claim 1; and
a display panel disposed on the fan-out sensor package, wherein the display panel is an organic light emitting diode (OLED) panel.

* * * * *